United States Patent [19]

Gleason

[11] 4,231,058

[45] Oct. 28, 1980

[54] TUNGSTEN-TITANIUM-CHROMIUM/-GOLD SEMICONDUCTOR METALLIZATION

[75] Inventor: K. Reed Gleason, Portland, Oreg.

[73] Assignee: The United States of America as represented by the Secretary of the Navy, Washington, D.C.

[21] Appl. No.: 963,067

[22] Filed: Nov. 22, 1978

[51] Int. Cl.³ .................... H01L 23/48; H01L 29/46; H01L 29/62

[52] U.S. Cl. ...................................... 357/67; 357/13; 357/56; 357/71

[58] Field of Search .................... 357/65, 13, 67, 71, 357/56

[56] References Cited

U.S. PATENT DOCUMENTS

| | | | |
|---|---|---|---|
| 3,010,057 | 11/1961 | Albert | 357/67 |
| 3,653,999 | 4/1972 | Fuller | 357/67 |
| 3,833,842 | 9/1974 | Cunningham et al. | 357/71 |
| 3,921,192 | 11/1975 | Goronkin et al. | 357/13 |

Primary Examiner—Andrew J. James
Attorney, Agent, or Firm—R. S. Sciascia; Philip Schneider; Melvin L. Crane

[57] ABSTRACT

Improved TRAPATT diodes in which the improvement comprises a high-temperature metallization on silicon from which the diodes are formed.

Metallization is applied to a silicon wafer by sputtering a layer of titanium, chromium, tungsten alloy followed by a gold layer. The desired diode shape and size is defined in the gold layer by use of a pattern of the proper shape and size in combination with a photolithographic process. The metallization layers and the silicon are then etched so as to form a plurality of individual shaped (mesa or ring structure) TRAPATT diodes. Such diodes can withstand 610° C. for one hour without degradation.

6 Claims, 2 Drawing Figures

TUNGSTEN-TITANIUM-CHROMIUM/GOLD SEMICONDUCTOR METALLIZATION

BACKGROUND OF THE INVENTION

This invention relates to silicon devices and more particularly to a high-temperature metallization on ring or mesa silicon devices for high-power, wide-pulse, continuous-wave microwave applications.

Heretofore junction impact avalanche transit time (IMPATT) diodes and trapped plasma avalanche triggered transit (TRAPATT) diodes have been developed which oscillate or amplify at microwave frequencies when mounted in an appropriate circuit and reverse-biased with sufficient current. Trapped plasma avalanche triggered transit (TRAPATT) diodes are two-terminal avalanche devices with single $p^+ - n - n^+$ or $p^+ - p - n^+$ structures which operate at higher threshold current, higher efficiency, higher power output, and lower frequency than IMPATT diodes. High efficiency of TRAPATT diodes is due to their ability to rapidly switch between a very high resistance state and a very low resistance state. The high-power densities at which TRAPATTs must operate produce severe electrical and thermal stresses. Special requirements must be imposed upon material (silicon) quality, device design, fabrication procedure, and heat sink configuration when TRAPATTs are operated CW or at wide pulse-widths.

Prior-art TRAPATTs have been fabricated using silicon epitaxial material upon which a gold layer has been deposited over a chromium layer. The diodes are then formed by well-known photolithographic etch processes and a gold mesa or ring is electroplated on the gold layer to provide a supporting base for securing electrical contacts. The opposite side of the epitaxial silicon material has a chromium layer and a gold layer which is secured onto a metallized diamond heat sink. Such a TRAPATT diode cannot withstand temperatures higher than 370° C. because the chromium is no barrier to the diffusion of gold into the silicon, and gold and silicon form a liquid phase at 370° C. Instead of chromium-gold, titanium-tungsten/gold may be used. These may be used as high temperature metallization for planar devices but cannot be used where silicon etching is required because (titanium-tungsten) dissolves in the etch. Prior art TRAPATT diodes have been set forth in an article "TRAPATT's High Power Devices for Wide Pulse and CW Microwave Applications," by K Reed Gleason et al, *IEEE Transactions on Parts Hybrids and Packaging*, Vol. PHP-13, No. 4, pp. 344–348, December 1977.

SUMMARY OF THE INVENTION

This invention provides a high temperature metallization on a silicon wafer which has a proper doping profile to form ring or mesa silicon devices. The metallization includes a layer of an alloy of titanium, chromium, and tungsten followed by a layer of gold. The desired diode shape and size (ring or circular mesa) is then defined in the gold by a photo-lithographic process.

A layer of gold of about 10 μm thickness is then electroplated in a pattern contained within the defined pattern so that a 5 to 10 μm margin of thin metallization is left around the electroplated gold. The added layer of gold provides supporting structure for attaching electrodes to the diode. The metallization layers and silicon waves are then etched to form a plurality of TRAPATT diodes each of which is mounted on a diamond heat sink by thermocompression. Diodes so formed and mounted upon a diamond heat sink will withstand a temperature of up to at least 610° C. for one hour without degradation.

DETAILED DESCRIPTION

Many TRAPATT diodes made in accordance with the teaching of this invention are fabricated simultaneously by use of a silicon wafer which has a proper doping profile such as $p^+ - n - n^+$ or $p^+ - p - n^+$. The silicon wafer is supported by a sapphire disc and thinned from about 12 mils thickness to a thickness of from 10 to 16 μm by chem-mechanical lapping in Sperry Si (CP4) etch using a mixture of 82 ml $HNO_3$:27 ml $CH_3COOH$: 16 ml HF. The thinned silicon is removed from the sapphire disc and the surface previously secured to the sapphire disc is mechanically wiped to produce a flat smooth surface. In thinning the wafer, abrasive techniques followed by etching are avoided because the wafers so formed are found to fracture easily. The chemical etching process is very fast requiring an etching time of from 4 to 8 minutes.

After thinning the silicon wafer, the wafer is metallized on the upper and lower surfaces by sputtering a layer of tungsten-titanium-chromium alloy onto the wafer followed by a layer of gold. For best results, it has been determined that the composition of the alloy should be any composition that has enough chromium to suppress etching in CP4 etch, enough titanium for good adhesion and enough tungsten to suppress the diffusion of gold into the W-Ti-Cr alloy layer.

The alloy layer has a thickness of from 500 Angstroms to about 2000 Angstroms with the gold layer of from about 500 Angstroms to about 250,000 Angstroms. The desired device shapes are than defined in the gold layer by any well known processes (photolithographic) and a gold layer to which the electrical contacts are secured is electroplated in a pattern contained within the defined pattern. The metallization layers and the silicon are etched to form a plurality of individual mesa or ring-structure TRAPATT diodes which may have an overall diameter of about 500 μm. The separate diodes are thermocompression-bonded onto a metallized diamond heat sink. After bonding, the silicon is additionally etched to move the silicon margin back from the metallization edge so that unbonded metal will not short the device.

Figure 1:
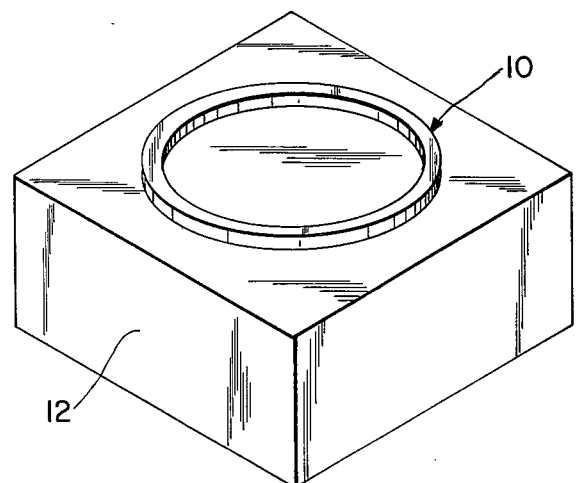
FIG. 1 illustrates a top view of an assembled ring-type TRAPATT diode.
Figure 2:
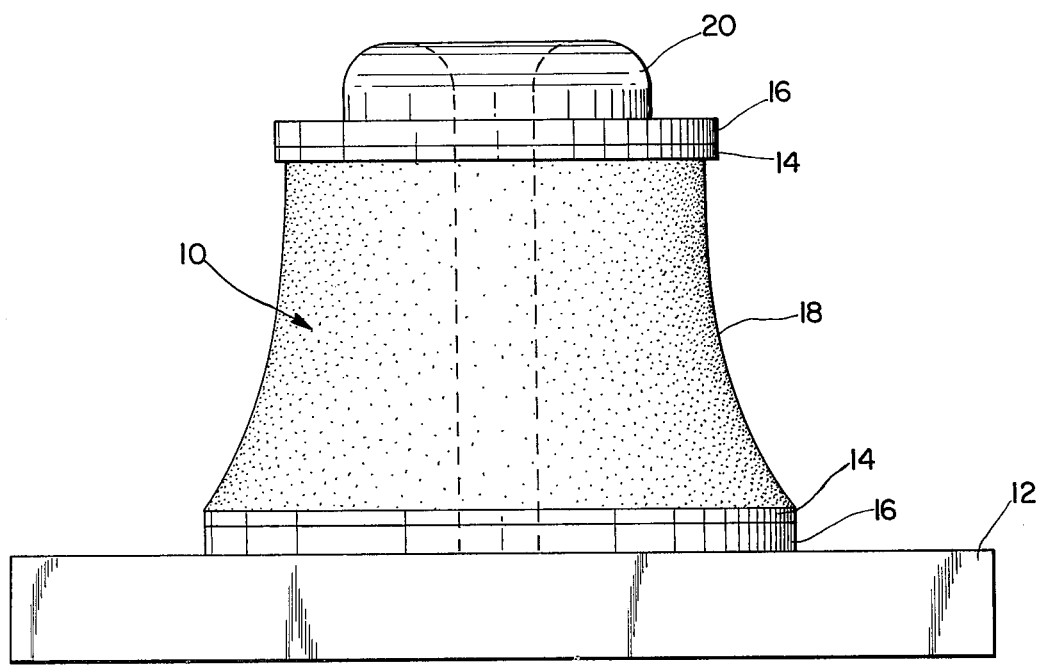
FIG. 2 illustrates a side view of an assembled ring-type TRAPATT diode.

FIG. 1 illustrates an enlarged top view of a ring TRAPATT diode 10 mounted onto a diamond heat sink 12. FIG. 2 is a side view of a ring TRAPATT diode illustrating the W, Ti, Cr alloy layers 14, the gold layers 16, and the + silicon 18 with the gold layer 20 on top for securing electrical leads to the diode. The wider area near the bottom of the silicon, as shown, is the p-n junction depletion region which does not etch as rapidly as the silicon layers where charge carriers are available. The metallized silicon diode is secured onto a diamond heat sink 12.

In fabrication of TRAPATT diodes the silicon wafer is prepared and placed in a vacuum chamber which is evacuated to a vacuum pressure of about $10^{-8}$ Torr. The W-Ti-Cr alloy layer is then sputtered onto each side of the silicon wafer by any process well known in the art to a thickness of from about 500 Å to about 2000 Å. The gold layers are then sputtered onto the W-Ti-Cr alloy layers in a vacuum of about $10^{-8}$ Torr. The diode shapes are then defined in one of the gold layers by well-known photolithographic processes. Once the pattern has been formed in the gold layer, a layer of hard gold such as SelRex HD of about 10 μm is electroplated onto the top gold layer in a pattern contained within the pattern of the gold layer so that a 5-10 μm margin of thin metallization is left around the electroplated gold. The gold layer, W-Ti-Cr alloy layer and the silicon are then etched to form the diodes. In the case of forming ring diode structures, a central aperture is etched through the silicon and the upper and bottom metallized layers. The silicon can be etched with CP4 etch, the alloy can be etched with a chromium etch (KOH and KMnO$_4$) at a temperature of 65° C. which does not dissolve the silicon or gold, and the gold etched by use of a cyanide solution. By using an etchant that affects each of the components separately, orthogonality of the layers may be maintained. Once the silicon, alloy, gold TRAPATT diode has been formed, the diode structure is bonded onto a diamond heat sink by thermocompression. The diamond heat sink is heated to a temperature of 260° C. and the diodes thermocompressed thereon by sufficient pressure applied to the upper gold layer without deforming the gold layer.

After bonding, the silicon is additionally etched to move the silicon margin back from the metallization edge so that unbonded metal will not short the device.

It has been determined that the chemical composition of the alloy metallization layer may be 56% W, 24% Ti, and 20% Cr which permits operation at a temperature of about 610° C. for one hour without degradation. Other percentages of the metals in the alloy and other metals may be used so long as the etching and operational heat problems are overcome.

TRAPATT diodes have a diameter of 500 μm as set forth herein have yielded power outputs of up to 63 W with 30-35% efficiency at 1.73 GHz when operated with 50 μs pulse widths and a 1% duty factor. CW power outputs of up to 8.3 W at 1.6 GHZ have also been obtained.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. An improved diode in which the improvement comprises:
   a metallization layer of an alloy of chromium, titanium and tungsten on silicon followed by a layer of gold.
2. An improved diode as claimed in claim 1 wherein: the composition of said alloy is 56% W, 24% Ti, 20% Cr.
3. An improved diode as claimed in claim 1 wherein: said alloy has a thickness of from about 500 Å to about 2000 Å.
4. An improved diode as claimed in claim 1 wherein: said layer of gold has a thickness of from about 500 Å to about 250,000 Å.
5. An improved diode as claimed in claim 3, in which: said layer of gold has a thickness of from about 500 Å to about 250,000 Å.
6. An improved diode as claimed in claim 4 in which: the composition of said alloy is 56% W, 24% Ti, 20% Cr.

* * * * *